United States Patent
Bakalski

(10) Patent No.: US 9,698,729 B2
(45) Date of Patent: Jul. 4, 2017

(54) OPTIMUM CURRENT CONTROL CMOS CASCODE AMPLIFIER

(71) Applicant: Infineon Technologies AG, Neubiberg (DE)

(72) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/932,390

(22) Filed: Nov. 4, 2015

(65) Prior Publication Data

US 2017/0126180 A1  May 4, 2017

(51) Int. Cl.
| | | |
|---|---|---|
| H03F 3/04 | (2006.01) | |
| H03F 1/14 | (2006.01) | |
| H03F 1/02 | (2006.01) | |
| H03F 3/193 | (2006.01) | |
| H03F 3/217 | (2006.01) | |

(52) U.S. Cl.
CPC ........... *H03F 1/0205* (2013.01); *H03F 3/193* (2013.01); *H03F 3/2171* (2013.01); *H03F 2200/294* (2013.01); *H03F 2200/451* (2013.01)

(58) Field of Classification Search
CPC ........................................................ H03F 3/04
USPC ................................. 330/311, 51, 124 R, 295
See application file for complete search history.

(56) References Cited

U.S. PATENT DOCUMENTS

| | | | |
|---|---|---|---|
| 5,428,316 A | 6/1995 | Molnar | |
| 5,877,654 A * | 3/1999 | Fong | H03F 1/086 330/292 |
| 7,064,614 B2 | 6/2006 | Feng et al. | |
| 2004/0246056 A1* | 12/2004 | Behzad | H03F 1/223 330/311 |
| 2006/0119435 A1* | 6/2006 | Oh et al. | H03F 1/223 330/311 |
| 2007/0096827 A1* | 5/2007 | Nguyen | H03F 1/0205 330/295 |
| 2010/0141337 A1* | 6/2010 | Chen | H03F 1/223 330/124 R |

(Continued)

OTHER PUBLICATIONS

"Chapter 11: The Current Mirror." Wiki Analog Devices, Sep. 23, 2013, 14 pages.

(Continued)

*Primary Examiner* — Patricia T Nguyen
(74) *Attorney, Agent, or Firm* — Eschweiler & Potashnik, LLC

(57) ABSTRACT

A CMOS cascode amplifier comprises a cascode circuit comprising a plurality of branches in parallel, each branch comprising a first transistor and a second switchable transistor connected in series forming a cascode pair, wherein the cascode circuit is configured to amplify an input signal. The CMOS cascode amplifier further comprises a bias circuit configured to bias the cascode circuit by providing a bias signal to the first transistor in each of the plurality of the branches in the cascode circuit. In addition, the CMOS cascode amplifier comprises a switching control circuit configured to control a quiescent current in the cascode circuit based on selectively activating the plurality of branches by providing a switching control signal that switches on the second switchable transistor in the one or more activated branches.

25 Claims, 9 Drawing Sheets

(56) References Cited

U.S. PATENT DOCUMENTS

| | | | | |
|---|---|---|---|---|
| 2010/0237945 A1* | 9/2010 | Cassia | ................ | H03F 1/223 |
| | | | | 330/277 |
| 2011/0221531 A1* | 9/2011 | Kim | ................ | H03F 1/223 |
| | | | | 330/284 |
| 2013/0310114 A1* | 11/2013 | Zohny | ................ | H03F 3/193 |
| | | | | 455/571 |
| 2014/0184328 A1* | 7/2014 | Allier | ................ | H03F 3/217 |
| | | | | 330/251 |

OTHER PUBLICATIONS

Whites, Keith W. "Lecture 17: BJT Biasing, Current Mirror." Whites, EE 320, Lecture 17, 2009, 10 pages.

"Current Mirror." Wikipedia, www.wikipedia.com, Sep. 25, 2015, 11 pages.

Long, S. Prof. "ECE145A/ECE218A Performance Limitations of Amplifiers." Dec. 29, 2010, 37 pages.

Glaser, Chris. "IQ: What it is, what it isn't, and how to use it." High Performance Analog Products, Texas Instruments Incororated, www.ti.com/aaj, 2Q 2011, Analog Applications Journal, 7 pages.

Padilla, Ivan R. "Quiescent Current Control Circuit for Class AB Amplifiers." Dissertation, New Mexico State University, Las Cruces, New Mexico, May 2007, 174 pages.

Kodeti, Narayana Murty. "White Paper on Silicon on Insulator (SOI) Implementation." Infotech Enterprises Ltd., www.infotech-enterprises.com, 12 pages.

"Chapter IV Low Noise Amplifier Design and Optimization." LNA Design and Optimiation, 57 pages.

* cited by examiner

OPTIMUM CURRENT CONTROL CMOS CASCODE AMPLIFIER

FIELD

The present disclosure relates to CMOS cascode amplifiers and, in particular to an architecture and a method for adjusting quiescent current in CMOS cascode amplifiers.

BACKGROUND

Cascode amplifiers are two-stage amplifiers composed of a transconductance amplifier followed by a current buffer having high input-output isolation, high input impedance, high output impedance, high gain etc. CMOS cascode amplifiers are commonly used as part of an RF front end device, for example, CMOS RF low noise amplifiers (LNA).

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
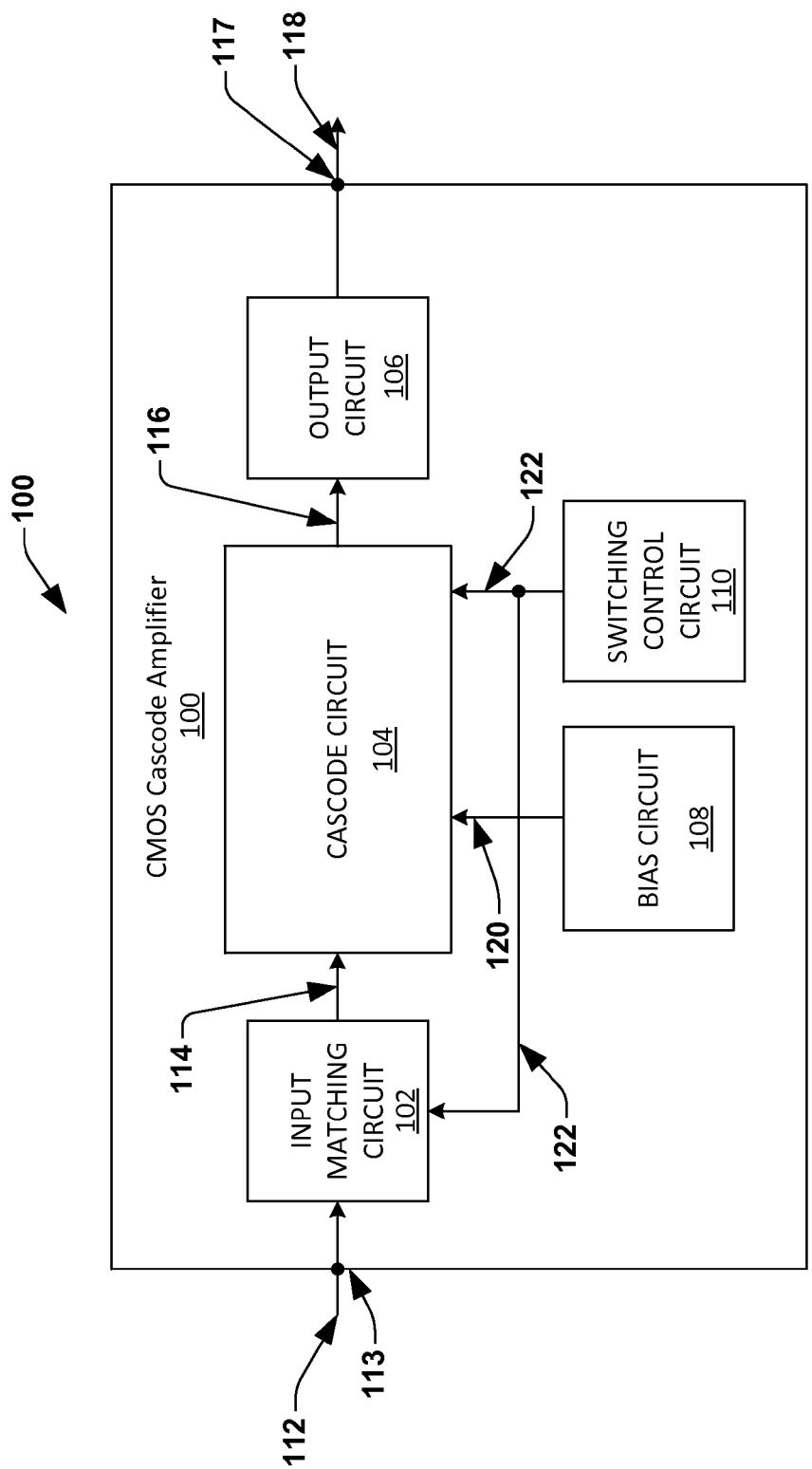
FIG. 1 shows a simplified block diagram of a CMOS cascode amplifier 100, according to one embodiment of the disclosure.

Cascode amplifiers have a quiescent current associated therewith, which is a standing current in the cascode amplifier when no input signal is applied to its input terminal. The quiescent currents have a direct impact on the output power, the gain, the optimal output impedance match, etc. of the cascode amplifier. In some instances, the quiescent current of the cascode amplifier is adjusted in order to adjust the gain, power dissipation, etc. The quiescent current can be adjusted by a reference current, for example by using a current mirror biasing circuit. Current mirror biasing circuits allow for adjusting the quiescent current based on an adjustable reference current. The quiescent current, however, is directly related to a size of the transistor and for a given transistor size, the quiescent current has an optimum range. Operating the cascode amplifier outside the optimum range of the quiescent current can lead to undesirable outputs. For example, a too low quiescent current for a given transistor size can cause strong nonlinearities, a noise increase and high temperature dependencies. Therefore, the quiescent current is typically adjusted only within the optimum range for a given transistor size, which greatly limits the possibility of adjusting the quiescent current in order to adjust the gain, power dissipation, etc. in cascode amplifiers.

In one embodiment of the disclosure, a CMOS cascode amplifier comprises a cascode circuit comprising a plurality of branches in parallel, each branch comprising a first switchable transistor and a second transistor connected in series forming a cascode pair, wherein the cascode circuit is configured to amplify an input signal. The cascode amplifier further comprises a bias circuit configured to bias the cascode circuit by providing a bias voltage to the second transistor in each of the plurality of the branches in the cascode circuit. In addition, the cascode amplifier comprises a switching control circuit configured to control a quiescent current in the cascode circuit based on selectively activating the plurality of branches by providing a switching control signal that switches on the first switchable transistor in the one or more activated branches.

In one embodiment of the disclosure, a cascode device comprises a cascode circuit comprising a first switchable circuit and a second circuit connected in series, configured to amplify an input signal. The cascode device further comprises a bias circuit configured to provide a bias voltage to the cascode arrangement and a switching control circuit configured to provide a switching control signal that selectively activates the cascode circuit.

In another embodiment of the disclosure, a method for current control in a CMOS cascode amplifier comprises providing a cascode circuit comprising a plurality of branches in parallel, each branch comprising a first transistor and a second transistor connected in series forming a cascode pair. The method further comprises biasing the cascode circuit by providing a bias voltage to the second transistor in each of the plurality of the branches in the cascode circuit, using a bias circuit and controlling a quiescent current in the cascode circuit based on selectively activating the plurality of branches by switching on the first transistor in the one or more activated branches by using a switching control circuit.

The present disclosure will now be described with reference to the attached drawing figures, wherein like reference numerals are used to refer to like elements throughout, and wherein the illustrated structures and devices are not necessarily drawn to scale. As utilized herein, terms "circuit", "component," "system," "unit," "element," and the like are intended to refer to a computer-related entity, hardware, software (e.g., in execution), and/or firmware. For example, a circuit or similar term can be a processor, a process running on a processor, a controller, an object, an executable program, a storage device, and/or a computer with a processing device. A set of elements or a set of other units can be described herein, in which the term "set" can be interpreted as "one or more."

As another example, a circuit or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a unit can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

As indicated above, quiescent currents have an impact on the output power, the gain, the optimal output impedance match, etc. of a cascode amplifier. Quiescent current can be adjusted in order to adjust the gain, power consumption, etc. in cascode amplifiers. For example, in wireless communication devices, when a mobile cell phone is continually moving and changing its distance from the base station, the power to maintain communication with the base station may need to increase as the distance increases between the base station and the cell phone. On the other hand, when the cell phone is closer to the base station, the output power may be reduced for the shorter-range communication. Quiescent currents in cascode amplifiers are typically adjusted by using current mirror bias circuits having an adjustable reference current. Since transistors in the cascode amplifiers are designed for a particular width-to-length (W/L) size, the quiescent current may be adjusted to a value that is not optimum for that particular W/L size, potentially causing strong nonlinearities, noise increase, high temperature dependencies and even damage to the transistors. In this disclosure, an architecture for optimum control of the quiescent current in CMOS cascode amplifiers is proposed. In particular, the quiescent current control is achieved by integrating a switch function in the cascode amplifier, rather than by adjusting the reference current in the current mirror biasing circuits.

In the following description, examples will be described and explained in more detail with respect to quiescent current control in CMOS cascode amplifiers. In particular, in one embodiment, a cascode amplifier comprising a switchable transistor is described.

FIG. 1 depicts a simplified block diagram of a CMOS cascode amplifier 100, according to one embodiment of the disclosure. In some embodiments, the CMOS cascode amplifier 100, for example, CMOS RF low noise amplifiers (LNA) can be part of an RF front end of a wireless communication device. In some embodiments, the CMOS cascode amplifier 100 is configured to receive an input signal 112 at an input port 113 of the CMOS cascode amplifier 100 and provide an output signal 118, which is usually an amplified version of the input signal 112 at an output port 117 of the CMOS cascode amplifier 100. In one embodiment, the CMOS cascode amplifier 100 comprises an input matching circuit 102, a cascode circuit 104 and an output circuit 106. Further, the CMOS cascode amplifier 100 comprises a bias circuit 108, a switching control circuit 110 and an inductor (not shown) coupled to the cascode circuit 104. The input matching circuit 102 is configured to receive the input signal 112 and generate a matched input signal 114. In some embodiments, the input matching circuit 102 is configured to provide input impedance matching.

The cascode circuit 104 is configured to receive the matched input signal 114 and generate an amplified input signal 116. In some embodiments, the cascode circuit 104 comprises a cascode amplifier, which is a two stage circuit comprising a transconductance amplifier followed by a buffer amplifier, forming a cascode pair. In some implementations, the input stage of the cascode circuit 104 is an FET common source amplifier, and an input voltage, for example, the matched input signal 114 is applied to its gate. The output stage is an FET common gate amplifier which is driven by the input stage. In some embodiments, the input stage and the output stage of the cascode circuit 104 each comprises a single transistor connected in series with one another forming a cascode pair. In some embodiments, a switch functionality is incorporated within the output stage of the cascode circuit 104, that is, a switch functionality is enabled within the FET common gate amplifier making it switchable based on a control signal. Further, in some embodiments, a total transistor size of the cascode pair comprising the FET common source amplifier and the FET common gate amplifier is split into portions, thereby forming a plurality of cascode pairs with smaller transistor widths. In some embodiments, each of the transistors within a cascode pair comprises a single transistor, however, in other embodiments; each of the transistors within a cascode pair can comprise a stacked transistor comprising a plurality of series connected transistors. The cascode circuit 104 has an optimum quiescent current associated therewith determined based on the total transistor size of the cascode circuit.

The output circuit 106 is configured to receive the amplified input signal 116 from the cascode circuit 104 and generate the output signal 118, which is usually a processed version of the amplified input signal 116. In some embodiments, the output circuit 106 is coupled to a drain terminal of the output stage, i.e. the FET common gate amplifier of the cascode circuit 106. In some embodiments, the output circuit 106 is configured to provide output impedance matching. The bias circuit 108 is configured to provide a bias signal 120 to the cascode circuit 104 in order to bias the cascode circuit 104 to an optimum operating point, for example, the optimum or predetermined value of the quiescent current for a given transistor size. In some embodiments, the bias circuit 108 comprises a current mirror circuit comprising a current mirror transistor coupled to the input stage of the cascode circuit 104. In some embodiments, the current mirror transistor has an adjustable reference current associated with it, which can be adjusted to adjust/set the quiescent current. In some embodiments, the current mirror transistor can comprise a stacked transistor comprising a plurality of series connected transistors.

The switching control circuit 110 is configured to provide a switching control signal 122 to selectively switch on and switch off the switchable FET common gate amplifier in the cascode circuit 104. In some embodiments, the switching control circuit 110 is configured to provide the switching control signal 122 to a gate terminal of the switchable FET common gate amplifier. In some embodiments, the switching control circuit 110 is further configured to provide the switching control signal 122 to adjust the input impedance provided by the input matching circuit 102. In some embodiments, the switching control circuit 110 comprises a level shifter circuit configured to translate a logic signal into a positive or negative voltage.

Figure 2:
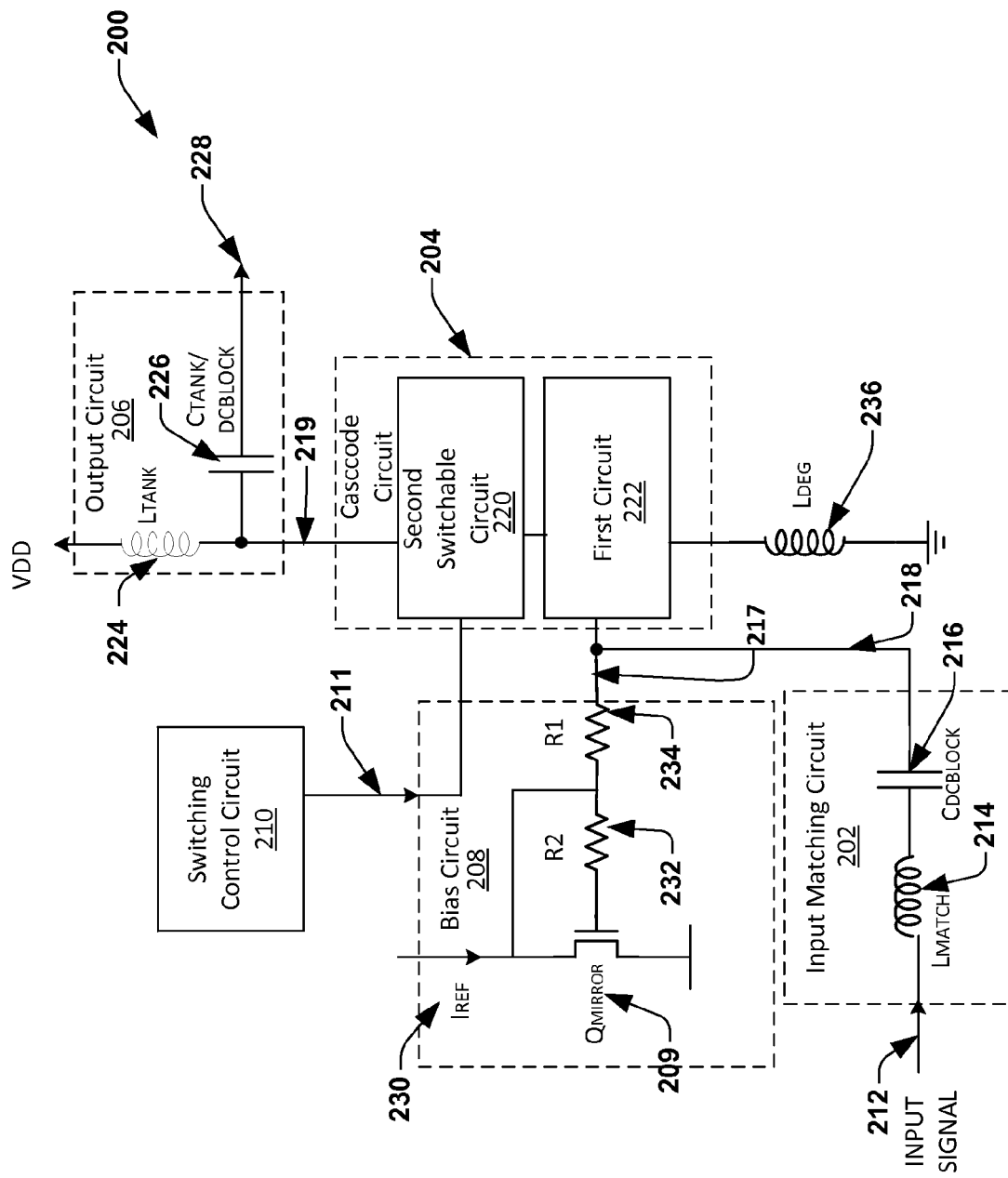
FIG. 2 shows an example implementation of a CMOS cascode amplifier 200, according to one embodiment of the disclosure.

FIG. 2 depicts an example implementation of a CMOS cascode amplifier 200, according to one embodiment of the disclosure. The CMOS cascode amplifier 200 comprises an input matching circuit 202, a cascode circuit 204 and an output circuit 206. Further, the CMOS cascode amplifier 200 comprises a bias circuit 208 and a switching control circuit 210 coupled to the cascode circuit 204. The input matching circuit 202 is configured to receive the input signal 212 and generate a matched input signal 218. In one embodiment, the input matching circuit 202 comprises an inductor $L_{MATCH}$ 214 in series with a capacitor $C_{DCBLOCK}$ 216, however, other implementations of the input matching circuit 202 are also possible. In some embodiments, the input matching circuit 202 is configured to provide input impedance matching.

The cascode circuit 204 is configured to receive the matched input signal 218 and generate an amplified input signal 219. The cascode circuit 204 comprises a first circuit 222 configured to receive the matched input signal 218 at an input of the first circuit 222 and a second switchable circuit 220 configured to provide an amplified input signal 219 at an output of the second switchable circuit 220 based on the matched input signal 218. In some implementations, the first circuit 222 of the cascode circuit 204 comprises a first transistor and the second switchable circuit 220 of the cascode circuit 204 comprises a second switchable transistor, forming a cascode pair. In some implementations, the first transistor comprises a transistor in a common source (CS) configuration and the second switchable transistor comprises a transistor in a common gate (CG) configuration. In some embodiments, a total transistor size of the cascode pair comprising the first transistor and the second switchable transistor is split into portions, thereby forming a plurality of cascode pairs in parallel branches, each branch comprising a cascode pair comprising a first transistor and a second switchable transistor with smaller transistor widths. In some embodiments, the cascode pairs comprising the first transistor and the second switchable transistor in each of the branches have equal W/L size. In other embodiments, the cascode pairs comprising the first transistor and the second switchable transistor in each of the branches have a weighted W/L size. The CMOS cascode amplifier 200 further comprises an inductor $L_{DEG}$ 236 coupled to the cascode circuit 204 configured to improve the gain and noise performance of the CMOS cascode amplifier 200. In some embodiments, the inductor $L_{DEG}$ 236 is coupled to the first circuit 222 of the cascode circuit 204.

The output circuit 206 is configured to receive the amplified input signal 219 from the cascode circuit 204 and generate the output signal 228, which is usually a processed version of the amplified input signal 219. In some embodiments, the output circuit 206 is coupled to an output terminal of the second switchable circuit 220, for example, a drain terminal of the second switchable transistor of the cascode circuit 206. In one embodiment, output circuit 206 comprises an inductor $L_{TANK}$ 224 and a capacitor $C_{TANK}$ 226 coupled to each other. However, in other embodiments, the output circuit 206 can be implemented differently. In some embodiments, the output circuit 206 is configured to provide output impedance matching.

The bias circuit 208 is configured to provide a bias signal 217 to the cascode circuit 204 in order to bias the cascode circuit 204 to an optimum operating point, for example, an optimum value of a quiescent current for a given transistor size. The bias circuit 208 comprises a current mirror circuit comprising a current mirror transistor 209 coupled to the first circuit 222 of the cascode circuit 204. Further, the bias circuit 208 comprises a first resistor R1 234 and a second resistor R2 232 coupled to a signal path of the bias signal 217. The current mirror transistor 209 has an adjustable reference current 230 associated with it, which can be adjusted to set the quiescent current to an optimum value. In some embodiments, the current mirror transistor 209 comprises a single transistor, however, in other embodiments, the current mirror transistor 209 can comprise a stacked transistor comprising a plurality of series connected transistors. Alternatively, in other embodiments, the bias circuit 208 can be implemented differently.

The switching control circuit 210 is configured to provide a switching control signal 211 to selectively switch on and switch off the second switchable circuit 220 in the cascode circuit 204, thereby activating and deactivating the cascode circuit 204. The switching control circuit 210 is configured to operate the CMOS cascode amplifier 200 in two modes, namely, an ON mode and an OFF mode. In the ON mode, the second switchable circuit 220 is switched ON, thereby activating the cascode circuit 204. In the OFF mode, the second switchable circuit 220 is switched OFF, thereby deactivating the cascode circuit 204.

Figure 3:
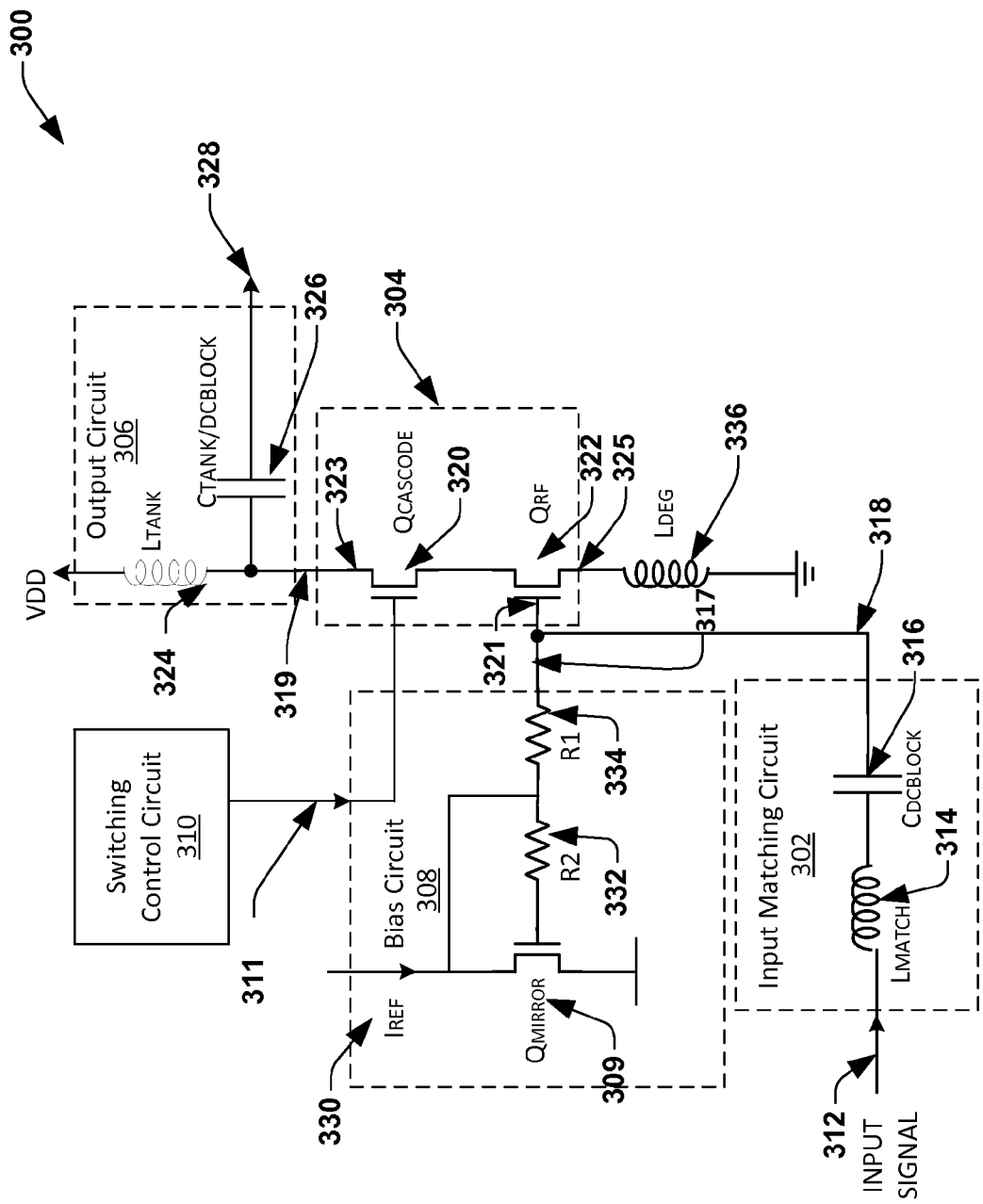
FIG. 3 shows an example implementation of a CMOS cascode amplifier 300, comprising a first transistor 322 and a second switchable transistor 320, according to one embodiment of the disclosure.

FIG. 3 shows an example implementation of a CMOS cascode amplifier 300, comprising a first transistor 322 and a second switchable transistor 320, according to one embodiment of the disclosure. The CMOS cascode amplifier 300 in FIG. 3 is similar to the CMOS cascode amplifier 200 in FIG. 2, with the cascode circuit 204 being replaced by a cascode circuit 304 comprising a first transistor 322 and a second switchable transistor 322. The CMOS cascode amplifier 300 comprises an input matching circuit 302, a cascode circuit 304 and an output circuit 306. Further, the CMOS cascode amplifier 300 comprises a bias circuit 308 and a switching control circuit 310 coupled to the cascode circuit 304. The input matching circuit 302 is configured to receive the input signal 312 and generate a matched input signal 318. In one embodiment, the input matching circuit 302 comprises an inductor $L_{MATCH}$ 314 in series with a capacitor $C_{DCBLOCK}$ 316, however, other implementations of the input matching circuit 302 are also possible.

The cascode circuit 304 is configured to receive the matched input signal 318 and generate an amplified input signal 319. The cascode circuit 304 comprises a first transistor 322 in a common source (CS) configuration configured to receive the matched input signal 318 at a gate terminal 321 of the first transistor 322. Further, the cascode circuit 304 comprises a second switchable transistor 320 in a common gate configuration in series with the first transistor 322 forming a cascode pair and configured to provide an amplified input signal 319 at a drain terminal 323 of the second switchable transistor 320 based on the matched input signal 318. The CMOS cascode amplifier 300 further comprises an inductor $L_{DEG}$ 336 coupled to the source terminal 325 of the first transistor 322 of the cascode circuit 304 configured to improve the gain and noise performance of the CMOS cascode amplifier 300.

The output circuit 306 is configured to receive the amplified input signal 319 from the cascode circuit 304 and generate the output signal 328, which is usually a processed version of the amplified input signal 319. The output circuit 306 is coupled to the drain terminal 323 of the second switchable transistor 320 of the cascode circuit 306. In one embodiment, output circuit 306 comprises an inductor $L_{TANK}$ 324 and a capacitor $C_{TANK}$ 326 coupled to each other. However, in other embodiments, the output circuit 306 can be implemented differently. In some embodiments, the output circuit 306 is configured to provide output impedance matching. The bias circuit 308 is configured to provide a bias signal 317 to the cascode circuit 304 in order to bias the cascode circuit 304 to an optimum operating point, for example, an optimum value of a quiescent current. The bias circuit 308 comprises a current mirror circuit comprising a current mirror transistor 309 coupled to the gate terminal 321 of the first transistor 322 of the cascode circuit 304. Further, the bias circuit 308 comprises a first resistor R1 334 and a second resistor R2 332 coupled to a signal path of the bias signal 317. The current mirror transistor 309 has an adjustable reference current 330 associated with it, which can be adjusted to set the quiescent current to the optimum value. In some embodiments, the current mirror transistor 309 comprises a single transistor, however, in other embodiments, the current mirror transistor 309 can comprise a plurality of stacked current mirror transistors. Alternatively, in other embodiments, the bias circuit 308 can be implemented differently such as a stacked current mirror or a Wilson current mirror.

The switching control circuit 310 is configured to provide a switching control signal 311 to selectively switch on and switch off the second switchable transistor 320 in the cascode circuit 304, thereby activating and deactivating the cascode circuit 304. The switching control circuit 310 is configured to operate the CMOS cascode amplifier 300 in two modes, namely, an ON mode and an OFF mode. In the ON mode, the second switchable transistor 320 is switched ON, thereby activating the cascode circuit 304. In the OFF mode, the second switchable transistor 320 is switched OFF, thereby deactivating the cascode circuit 304. In some embodiments, the switching control circuit 310 comprises a level shifter circuit configured to translate a logic signal into a positive or negative voltage.

Figure 4:
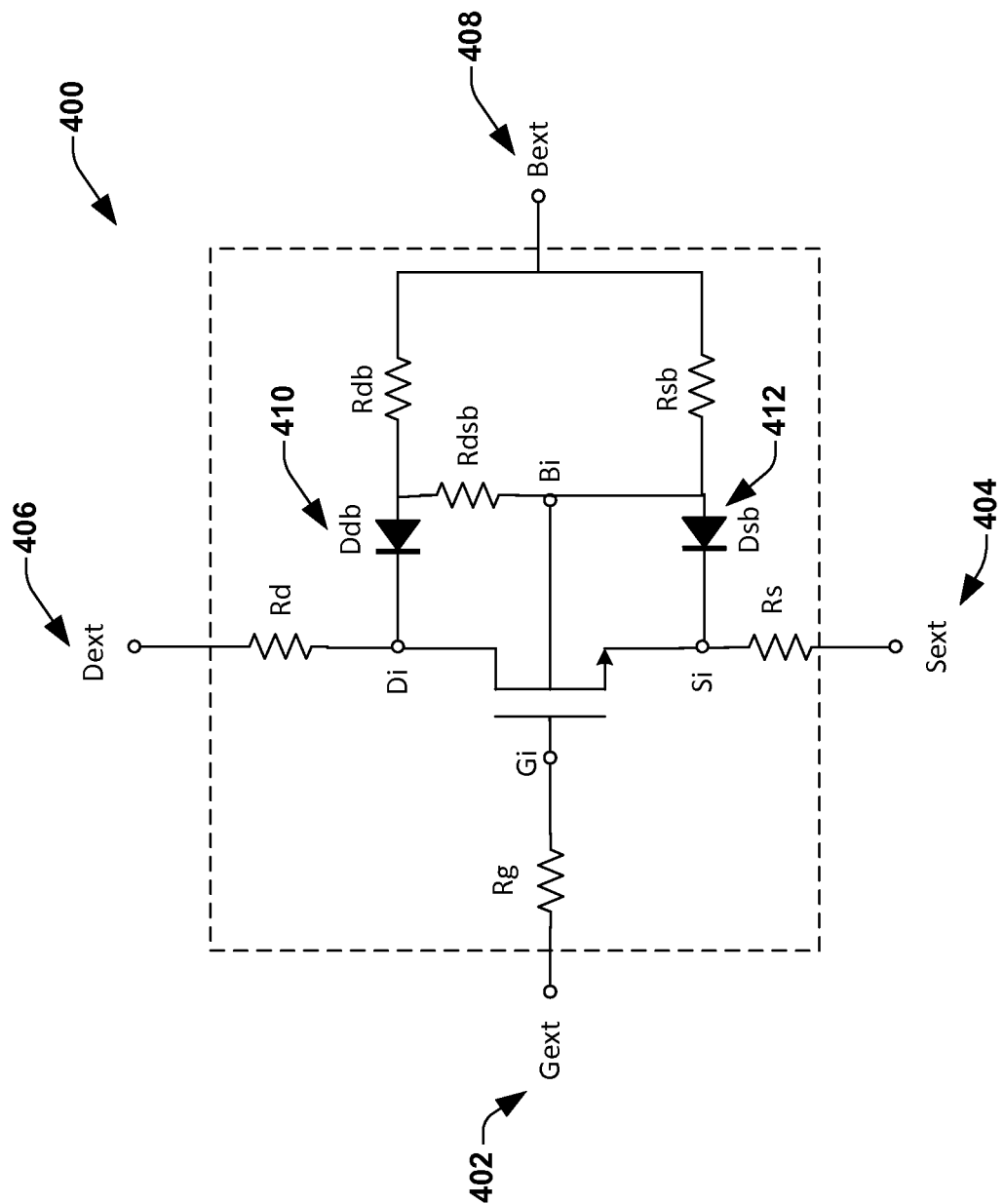
FIG. 4 shows an example implementation of a transistor switch 400, according to one embodiment of the disclosure.

FIG. 4 shows an example implementation of a transistor switch 400, according to one embodiment of the disclosure. In some embodiments, the second switchable transistor 320 in FIG. 3 can be implemented similar to the transistor switch 400 in FIG. 4. The transistor switch 400 comprises a transistor, for example, an NMOS transistor comprising a gate terminal 402, a source terminal 404, a drain terminal 406 and a bulk terminal 408. To enable the switch functionality of the transistor switch 400, substrate bulk diodes Ddb 410 and Dsb 412 are disabled by providing a negative voltage to the bulk terminal 408. Disabling the substrate bulk diodes Ddb 410 and Dsb 412 reduces the parasitic capacitances of the transistor switch 400 and also allows the usage of stacked radio frequency (RF) transistors. In some embodiments, the transistor switch 400 comprises a stacked transistor comprising a plurality of series connected transistors. Further, the transistor switch 400 is switched OFF by providing, for example, a negative voltage to the gate terminal 402 and the transistor switch 400 is switched ON by providing a positive voltage to the gate terminal 402. In some embodiments, the transistor switch 400 can be implemented through Silicon on Insulator (SOI) process where the body of the transistor switch 400 is biased instead of the bulk.

Figure 5:
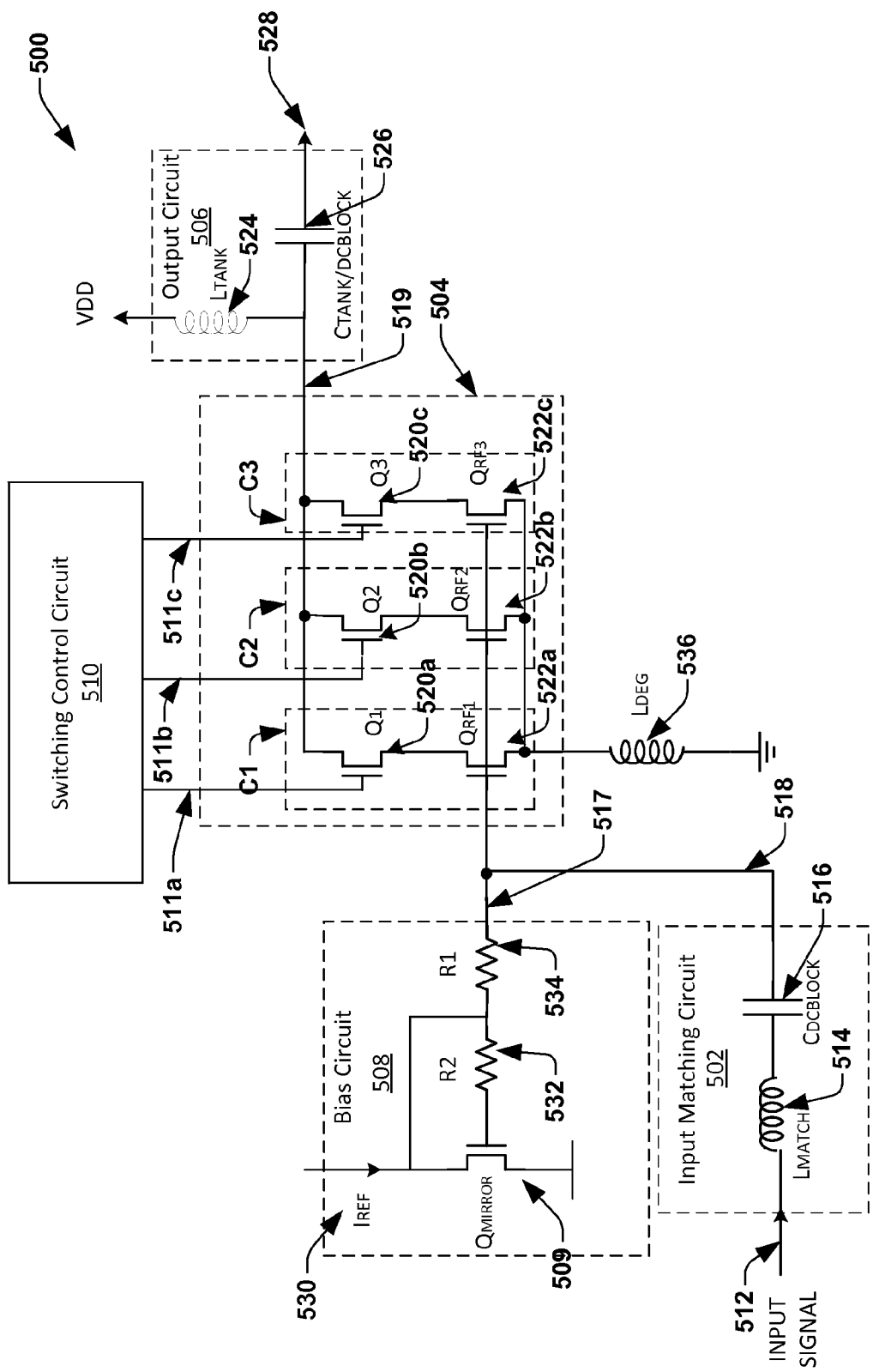
FIG. 5 shows an example implementation of a CMOS cascode amplifier 500 comprising a plurality of cascode pairs, according to one embodiment of the disclosure.

FIG. 5 shows an example implementation of a CMOS cascode amplifier 500 comprising a plurality of cascode pairs, according to one embodiment of the disclosure. The CMOS cascode amplifier 500 in FIG. 5 is similar to the CMOS cascode amplifier 300 in FIG. 3, wherein a total transistor size of the cascode pair comprising the first transistor 322 and the second switchable transistor 320 is split into portions, thereby forming a plurality of cascode pairs, each cascode pair comprising a first transistor and a second switchable transistor with smaller transistor widths. In the embodiment of FIG. 5, the cascode circuit 504 comprises 3 cascode pairs, namely, C1, C2 and C3, however, in other embodiments, the cascode circuit 504 can comprise any number of cascode pairs. The CMOS cascode amplifier 500 comprises an input matching circuit 502, a cascode circuit 504 and an output circuit 506. Further, the CMOS cascode amplifier 500 comprises a bias circuit 508 and a switching control circuit 510 coupled to the cascode circuit 504. The input matching circuit 502 is configured to receive the input signal 512 and generate a matched input signal 518. In one implementation, the input matching circuit 502 comprises an inductor $L_{MATCH}$ 514 in series with a capacitor $C_{DCBLOCK}$ 516, however, other implementations of the input matching circuit 502 are also possible.

The cascode circuit 504 is configured to receive the matched input signal 518 and generate an amplified input signal 519, which is an amplified version of the matched input signal 518. The cascode circuit 504 comprises a first cascode pair C1 comprising a first transistor 522a in common source (CS) configuration configured to receive the matched input signal 518 at a gate terminal of the first transistor 522a and a second switchable transistor 520a in common gate (CG) configuration in series with the first transistor 522a. The cascode circuit 504 further comprises a second cascode pair C2 comprising a first transistor 522b in CS configuration configured to receive the matched input signal 518 at a gate terminal of the first transistor 522b and a second switchable transistor 520b in CG configuration in series with the first transistor 522b. In addition, the cascode circuit 504 comprises a third cascode pair C3 comprising a first transistor 522c in CS configuration configured to receive the matched input signal 518 at a gate terminal of the first transistor 522c and a second switchable transistor 520c in CG configuration in series with the first transistor 522c. In some embodiments, the cascode pairs C1, C2 and C3 are arranged in parallel branches. In some embodiments, the cascode pairs C1, C2 and C3 have equal W/L size. In other embodiments, the cascode pairs C1, C2 and C3 have weighted W/L size. The CMOS cascode amplifier 500 further comprises an inductor $L_{DEG}$ 536 coupled to the source terminals 325 of each of the first transistors 522a, 522b and 522c respectively, of the cascode circuit 504. In some embodiments, the inductor $L_{DEG}$ 536 is configured to improve a gain and noise performance of the CMOS cascode amplifier 500.

The output circuit 506 is configured to receive the amplified input signal 519 from the cascode circuit 504 and generate the output signal 528, which is usually a processed version of the amplified input signal 519. The output circuit 506 is coupled to drain terminals of each of the second switchable transistor 520a, 520b and 520c respectively, of the cascode circuit 506. In one embodiment, the output circuit 506 comprises an inductor $L_{TANK}$ 524 and a capacitor $C_{TANK}$ 526 coupled to each other. However, in other embodiments, the output circuit 506 can be implemented differently. In some embodiments, the output circuit 506 is configured to provide output impedance matching.

The bias circuit 508 is configured to provide a bias signal 517 to the gate terminals of each of the first transistors 522a, 522b and 522c respectively of the cascode circuit 504 in order to bias the cascode circuit 504 to a predetermined (e.g., an optimum) operating point, for example, an optimum value of a quiescent current. In some embodiments, the bias circuit 508 comprises a current mirror circuit comprising a current mirror transistor 509 coupled to the gate terminals of each of the first transistors 522a, 522b and 522c respectively of the cascode circuit 504. Further, the bias circuit 508 comprises a first resistor R1 534 and a second resistor R2 532 coupled to a signal path of the bias signal 517. The current mirror transistor 509 has an adjustable reference current $I_{REF}$ 530 associated with it in one embodiment. In some embodiments, the adjustable reference current 530 is adjusted to set an optimum/predetermined quiescent current for a complete transistor width of all the cascode pairs. Each of the cascode pairs in the cascode circuit 504 has an optimum quiescent current associated with it depending on a transistor width of the respective cascode pair. Since the first transistors 522a, 522b and 522c in each of the cascode pairs C1, C2 and C2 respectively, receive the same bias signal 517, the quiescent current for each cascode pair scales to its individual width. In such embodiments, the quiescent current of the CMOS cascode amplifier 500 is adjusted by selectively deactivating the cascode pairs C1, C2 and C3, since switching off one or more cascode pairs still keeps the remaining cascode pairs in the same operation mode. Therefore, in such embodiments, the quiescent current can be adjusted by selectively switching off the second switchable transistors 520a, 520b and 520c in each of the cascode pairs C1, C2 and C3 respectively, rather than by adjusting the reference current $I_{REF}$ 530, as is done in conventional approaches. In some embodiments, the current mirror transistor 509 comprises a single transistor, however, in other embodiments, the current mirror transistor 509 can comprise a stacked transistor comprising a plurality of series connected transistors. Alternatively, in other embodiments, the bias circuit 508 can be implemented differently.

The switching control circuit 510 is configured to provide a switching control signals 511a, 511b and 511c to selectively switch on and switch off the second switchable transistors 520a, 520b and 520c respectively, in the cascode circuit 504, thereby individually activating and deactivating the respective cascode pairs C1, C2 and C3 of the cascode circuit 504. Selectively switching on the second switchable transistors 520a, 520b and 520c comprises individually turning on one or more of the second switchable transistors 520a, 520b and 520c in the cascode pairs C1, C2 and C3, respectively. The switching control circuit 510 is configured to individually operate each of the cascode pairs C1, C2 and C3 of the CMOS cascode amplifier 500 in two modes, namely, an ON mode and an OFF mode. In the ON mode, the second switchable transistor of a respective cascode pair is switched ON, thereby activating the respective cascode pair. In the OFF mode, the second switchable transistor of a respective cascode pair is switched OFF, thereby deactivating the respective cascode pair.

Figure 6:
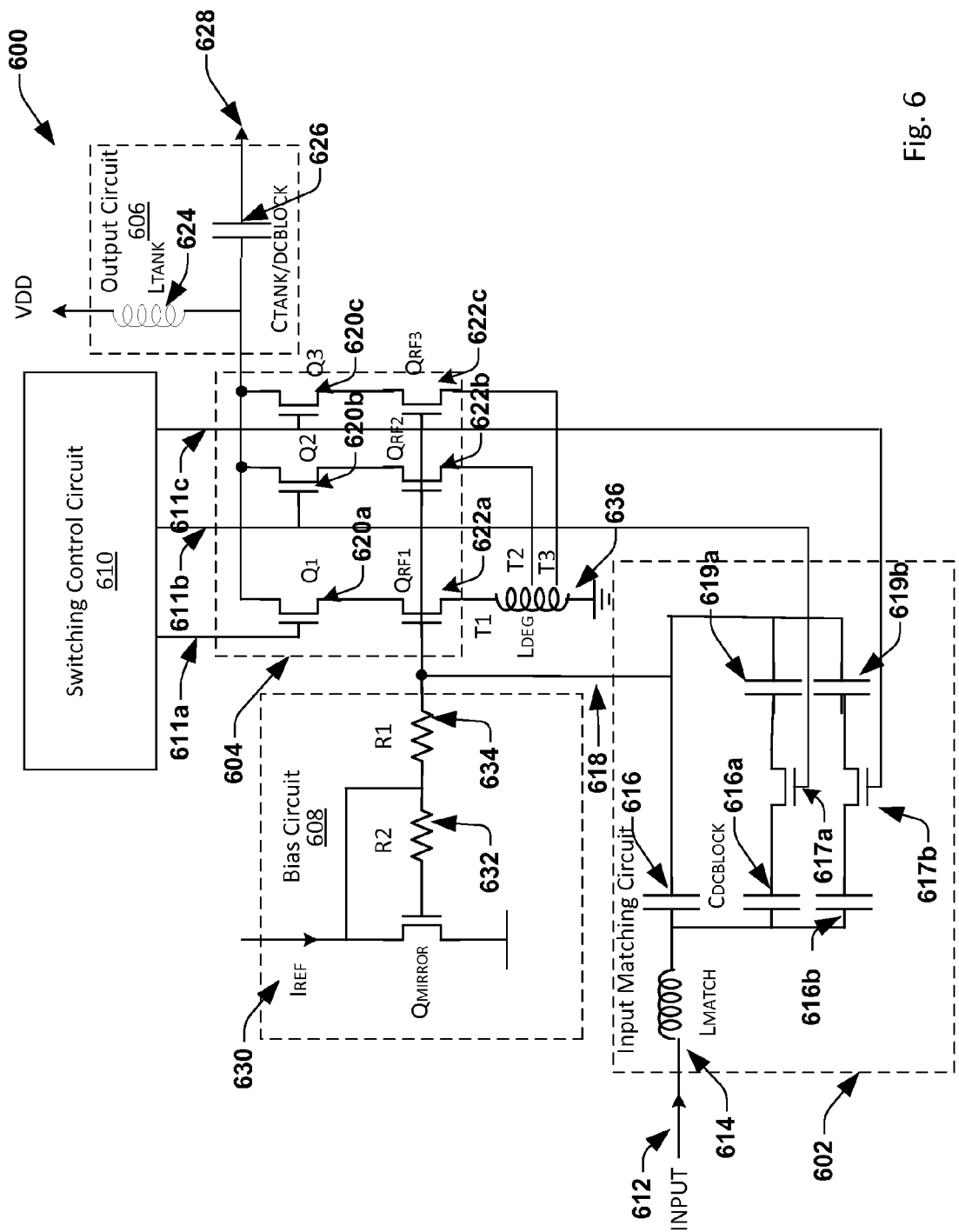
FIG. 6 shows an example implementation of a CMOS cascode amplifier 600 optimized for multiple frequency bands, according to one embodiment of the disclosure.

FIG. 6 shows an example implementation of a CMOS cascode amplifier 600 optimized for multiple frequency bands, according to one embodiment of the disclosure. The CMOS cascode amplifier 600 in FIG. 6 is similar to the CMOS cascode amplifier 500 in FIG. 5, comprising an input matching circuit 602, a cascode circuit 604 and an output circuit 606. Further, the CMOS cascode amplifier 500 comprises a bias circuit 608, a switching control circuit 610 and an inductor $L_{DEG}$ 636 coupled to the cascode circuit 604. The CMOS cascode amplifier 600 allows for the adaptive adjustment of the transistor size with respect to a frequency of operation. For example, lower frequency bands require larger transistor width for optimum operation and higher frequency bands require smaller transistor widths for optimum operation. Therefore, selectively switching off one or more cascode pairs based on the switching control signals 611a, 611b and 611c, as explained with respect to FIG. 5 enables the operation of the CMOS cascode amplifier 600 in various frequency bands. Further, in some embodiments, an input impedance of the CMOS cascode amplifier 600 can be adjusted in order to match the different frequency bands. In some embodiments, tuning the input impedance is achieved by using a tunable input matching circuit, for example, the input matching circuit 602 of FIG. 6 comprising selectable capacitors 616a and 616b in parallel branches. In some embodiments, the capacitors 616a and 616b are selectively activated by selectively switching on the switches 617a and 617b respectively based on the switching control signals, for example, 611b and 611c from the switching control circuit 610. In some embodiments, the input matching circuit 602 further comprises additional capacitors 619a and 619b configured to provide a DC free drain/source voltage to the switches 617a and 617b respectively. The additional capacitors 619a and 619b are required only when there is DC content in the input signal 612. Further, to optimize the operation of the CMOS cascode amplifier 600 for various frequency bands, in some embodiments, the inductor $L_{DEG}$ 636 is provided with a plurality of taps T1, T2, T3 etc. with each tap corresponding to a source terminal of a respective cascode pair of the plurality of cascode pairs.

Figure 7:
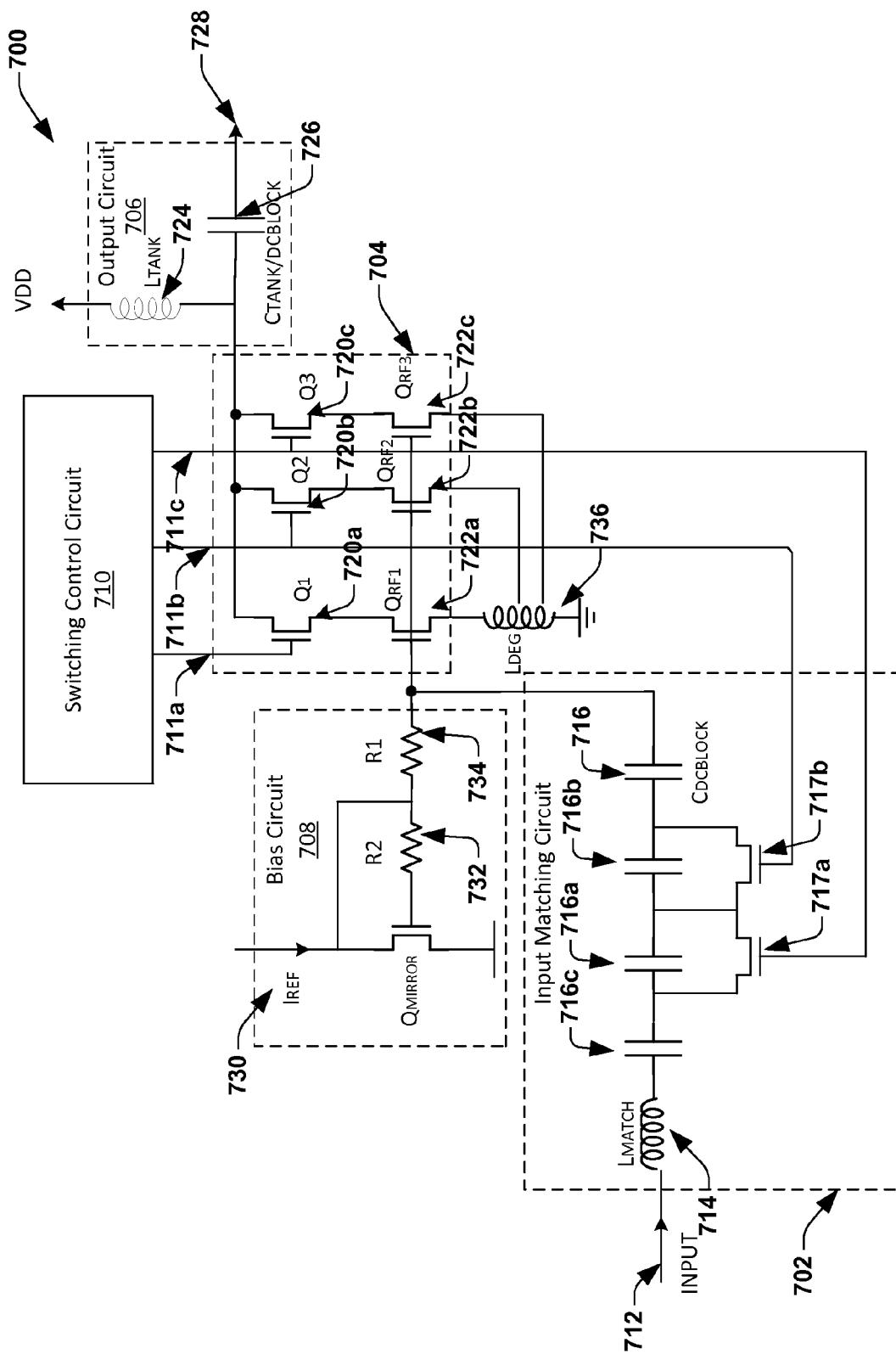
FIG. 7 shows an example implementation of a CMOS cascode amplifier 700 optimized for multiple frequency bands, according to another embodiment of the disclosure.

FIG. 7 shows an example implementation of a CMOS cascode amplifier 700 optimized for multiple frequency bands, according to another embodiment of the disclosure. The CMOS cascode amplifier 700 in FIG. 7 is similar to the CMOS cascode amplifier 600 in FIG. 6, having an alternate implementation for the input matching circuit 602. The input matching circuit 702 in FIG. 7 comprises a plurality of series connected selectable capacitors, for example, 716a and 716, which are selectively activated by selectively switching off the switches 717a and 717b respectively based on the switching control signals, for example, 711c and 711b from the switching control circuit 710. In some embodiments, the input matching circuit 702 further comprises an additional capacitor 716c configured to provide a DC free drain/source voltage to the switches 717a and 717b. The additional capacitor 716c is required only when there is DC content in the input signal 712. In other embodiments, alternate implementations of the input matching circuit 702 are also possible.

Figure 8:
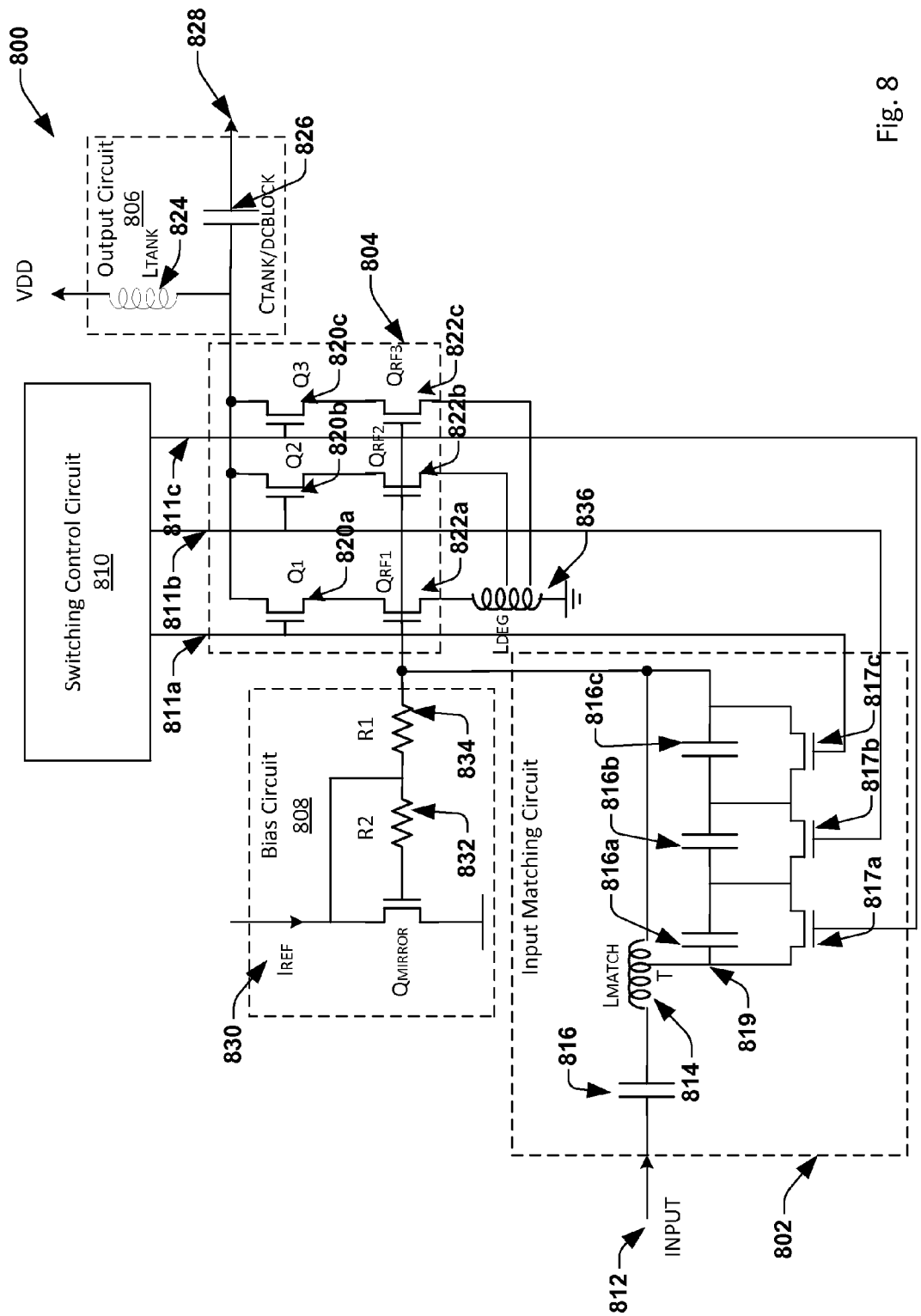
FIG. 8 shows an example implementation of a CMOS cascode amplifier 800 optimized for multiple frequency bands, according to another embodiment of the disclosure.

FIG. 8 shows an example implementation of a CMOS cascode amplifier 800 optimized for multiple frequency bands, according to another embodiment of the disclosure. The CMOS cascode amplifier 800 in FIG. 8 is similar to the CMOS cascode amplifier 700 in FIG. 7, having an alternate implementation for the input matching circuit 702. The input matching circuit 802 in FIG. 8 comprises a tunable inductor $L_{MATCH}$ 814 configured to provide a variable inductance based on tapping the inductor 814. Further, the input matching circuit 802 comprises a plurality of selectable capacitors in series, for example, 816a, 816b and 816c, which are selectively activated by selectively switching off the switches 817a, 817b and 817c respectively based on the switching control signals, for example, 811c, 811b and 811a from the switching control circuit 810. In some embodiments, the inductor tap T of the tunable inductor $L_{MATCH}$ 814 corresponds to an input terminal 819 of the plurality of the selectable capacitors in series. In some embodiments, the input matching circuit 802 further comprises an additional capacitor 816 configured to provide a DC free drain/source voltage to the switches 817a, 817b and 817c. The additional capacitor 816 is required only when there is DC content in the input signal 812. The input matching circuit 802 depicts one non-limiting implementation of the tunable inductor 814, however, in other embodiments, alternate implementations of the tunable inductor 814 are also possible.

Figure 9:
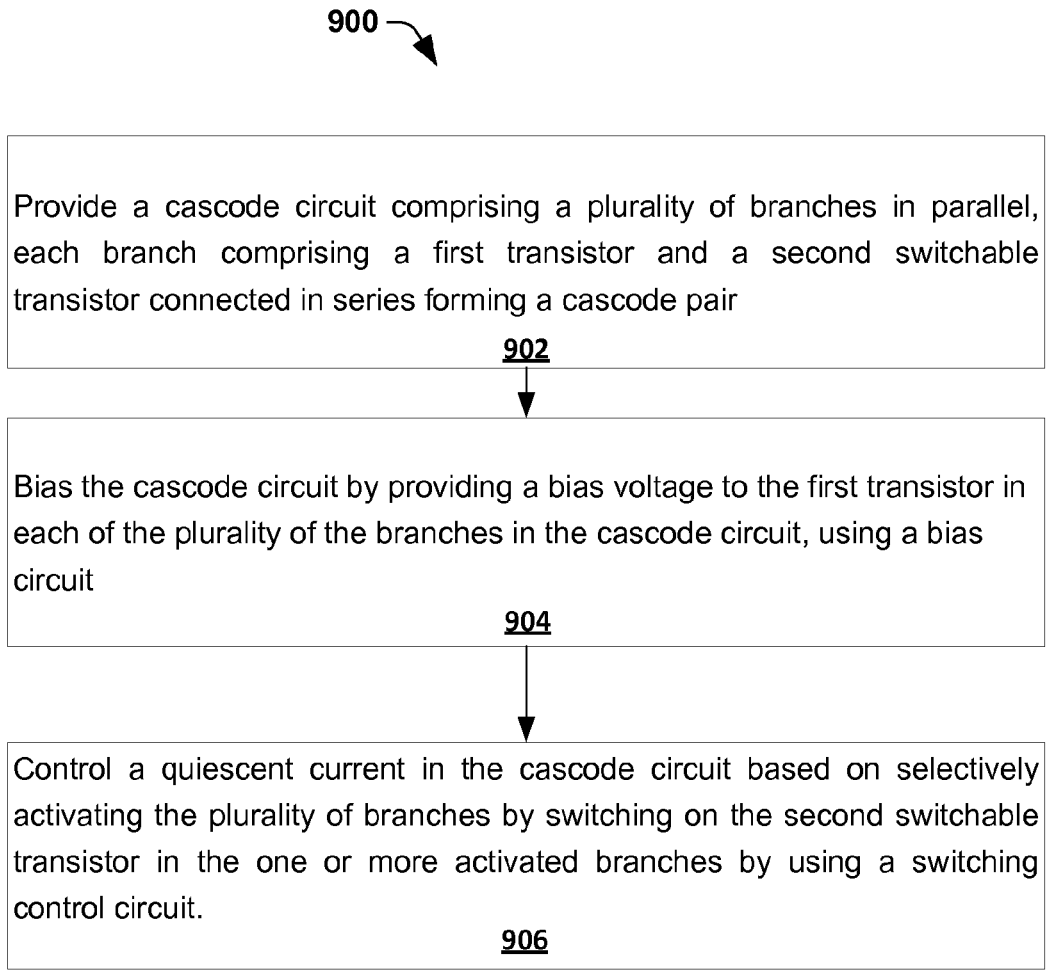
FIG. 9 shows a flowchart of a method 900 for implementing an optimum quiescent current control in CMOS cascode amplifiers, according to one embodiment of the disclosure.

FIG. 9 shows a flowchart of a method 900 for implementing an optimum quiescent current control in CMOS cascode amplifiers, according to one embodiment of the disclosure. The method 900 is described herein with respect to the CMOS cascode amplifier 500 of FIG. 5. At 902, a cascode circuit 504 comprising a plurality of branches in parallel, each branch comprising a cascode pair comprising a first transistor, for example, 522a, 522b and 522c and a second switchable transistor, for example, 520a, 520b and 520, connected in series with one another is provided. At 904, the cascode circuit 504 is biased to an optimum operating point, for example, in order to obtain a predetermined quiescent current, by providing a bias signal 517 to the first transistor, for example, 522a, 522b and 522c of the cascode pair in each of the plurality of the branches in the cascode circuit 504, using a bias circuit 508. In some embodiments, the predetermined quiescent current is determined based on a total transistor size of the transistors of all the cascode pairs C1, C2 and C3. At 906, a quiescent current in the cascode circuit 504 is controlled based on selectively activating the plurality of branches comprising the cascode pairs by switching on the second switchable transistor, for example, 520a, 520 and 520c, in the one or more activated branches by using a switching control circuit 510.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

The invention claimed is:

1. A CMOS cascode amplifier, comprising:
   a cascode circuit comprising a plurality of branches in parallel, each branch comprising a first transistor and a second switchable transistor connected in series forming a cascode pair, wherein the cascode circuit is configured to amplify an input signal;
   a bias circuit configured to bias the cascode circuit by providing a bias signal to the first transistor in each of the plurality of the branches in the cascode circuit; and
   a switching control circuit configured to control a quiescent current in the cascode circuit based on selectively activating the plurality of branches by providing a switching control signal that switches on the second switchable transistor in the one or more activated branches,
   wherein the cascode pair comprising the first transistor and the second switchable transistor in each of the branches have weighted W/L size.

2. The amplifier of claim 1, wherein the cascode circuit is further configured to receive the input signal at a gate terminal of the first transistor in each of the plurality of branches of the cascode circuit.

3. The amplifier of claim 1, wherein the bias circuit comprises a third transistor configured to form a current mirror with the cascode circuit.

4. The amplifier of claim 3, wherein the bias signal is applied to the cascode circuit in order to obtain a predetermined quiescent current in the cascode circuit.

5. The amplifier of claim 4, wherein the predetermined quiescent current is obtained by adjusting a reference current in the current mirror circuit.

6. The amplifier of claim 4, wherein the predetermined quiescent current is determined based on a total transistor width of the first transistor and the second switchable transistor in each of the plurality of the parallel branches in the cascode circuit.

7. The amplifier of claim 1, wherein the switching control circuit comprises a level shifter circuit configured to provide a positive voltage or a negative voltage to a gate terminal of the second switchable transistor based on the switching control signal.

8. A CMOS cascode amplifier, comprising:
a cascode circuit comprising a plurality of branches in parallel, each branch comprising a first transistor and a second switchable transistor connected in series forming a cascode pair, wherein the cascode circuit is configured to amplify an input signal;
a bias circuit configured to bias the cascode circuit by providing a bias signal to the first transistor in each of the plurality of the branches in the cascode circuit;
a switching control circuit configured to control a quiescent current in the cascode circuit based on selectively activating the plurality of branches by providing a switching control signal that switches on the second switchable transistor in the one or more activated branches; and
an input matching circuit coupled to an input signal path of the cascode circuit configured to tune an input impedance of the cascode circuit, wherein the input matching circuit comprises an input inductance in series with a variable capacitive element comprising a plurality of selectable capacitors.

9. The amplifier of claim 8, wherein the cascode circuit is further configured to receive the input signal at a gate terminal of the first transistor in each of the plurality of branches of the cascode circuit.

10. The amplifier of claim 8, wherein the bias circuit comprises a third transistor configured to form a current mirror with the cascode circuit.

11. The amplifier of claim 10, wherein the bias signal is applied to the cascode circuit in order to obtain a predetermined quiescent current in the cascode circuit.

12. The amplifier of claim 11, wherein the predetermined quiescent current is obtained by adjusting a reference current in the current mirror circuit.

13. The amplifier of claim 11, wherein the predetermined quiescent current is determined based on a total transistor width of the first transistor and the second switchable transistor in each of the plurality of the parallel branches in the cascode circuit.

14. The amplifier of claim 8, wherein the switching control circuit comprises a level shifter circuit configured to provide a positive voltage or a negative voltage to a gate terminal of the second switchable transistor based on the switching control signal.

15. The amplifier of claim 8, wherein the cascode pair comprising the first transistor and the second switchable transistor in each of the branches have an equal width-to-length (W/L) size.

16. The amplifier of claim 8, wherein the cascode pair comprising the first transistor and the second switchable transistor in each of the branches have weighted width-to-length (W/L) size.

17. The amplifier of claim 8, wherein the switching control circuit is further configured to selectively activate one or more of the plurality of selectable capacitors based on the switching control signal.

18. A CMOS cascode amplifier, comprising:
a cascode circuit comprising a plurality of branches in parallel, each branch comprising a first transistor and a second switchable transistor connected in series forming a cascode pair, wherein the cascode circuit is configured to amplify an input signal;
a bias circuit configured to bias the cascode circuit by providing a bias signal to the first transistor in each of the plurality of the branches in the cascode circuit;
a switching control circuit configured to control a quiescent current in the cascode circuit based on selectively activating the plurality of branches by providing a switching control signal that switches on the second switchable transistor in the one or more activated branches; and
a degradation inductance coupled to the cascode circuit configured to adjust a gain of the cascode circuit, the degradation inductance comprising a plurality of taps, each of the taps being coupled to a source terminal of the first transistor of a respective branch.

19. The amplifier of claim 18, wherein the cascode circuit is further configured to receive the input signal at a gate terminal of the first transistor in each of the plurality of branches of the cascode circuit.

20. The amplifier of claim 18, wherein the bias circuit comprises a third transistor configured to form a current mirror with the cascode circuit.

21. The amplifier of claim 20, wherein the bias signal is applied to the cascode circuit in order to obtain a predetermined quiescent current in the cascode circuit.

22. The amplifier of claim 21, wherein the predetermined quiescent current is obtained by adjusting a reference current in the current mirror circuit.

23. The amplifier of claim 21, wherein the predetermined quiescent current is determined based on a total transistor width of the first transistor and the second switchable transistor in each of the plurality of the parallel branches in the cascode circuit.

24. The amplifier of claim 18, wherein the cascode pair comprising the first transistor and the second switchable transistor in each of the branches have an equal width-to-length (W/L) size.

25. The amplifier of claim 17, wherein the cascode pair comprising the first transistor and the second switchable transistor in each of the branches have weighted width-to-length (W/L) size.

* * * * *